(12) United States Patent
Hirata et al.

(10) Patent No.: US 7,745,859 B2
(45) Date of Patent: Jun. 29, 2010

(54) SOLID-STATE IMAGE SENSING APPARATUS AND FABRICATION METHOD THEREOF

(75) Inventors: Tatsuya Hirata, Osaka (JP); Shouzi Tanaka, Nara (JP); Ryohei Miyagawa, Kyoto (JP); Kazunari Koga, Kyoto (JP)

(73) Assignee: Panasonic Corporation, Osaka (JP)

( * ) Notice: Subject to any disclaimer, the term of this patent is extended or adjusted under 35 U.S.C. 154(b) by 284 days.

(21) Appl. No.: 11/651,022

(22) Filed: Jan. 9, 2007

(65) Prior Publication Data

US 2007/0241374 A1 Oct. 18, 2007

(30) Foreign Application Priority Data

Apr. 17, 2006 (JP) .............................. 2006-113171

(51) Int. Cl.
*H01L 31/062* (2006.01)
*H01L 31/113* (2006.01)
(52) U.S. Cl. ...................... 257/292; 257/291; 257/461; 257/462
(58) Field of Classification Search .................. 257/213, 257/291, 292, 461, 462, 233
See application file for complete search history.

(56) References Cited

U.S. PATENT DOCUMENTS 6,504,193 B1 * 1/2003 Ishiwata et al. ............. 257/291
6,610,557 B2 * 8/2003 Lee et al. ...................... 438/87
2006/0157756 A1 * 7/2006 Tanaka et al. ................ 257/291
2007/0141797 A1 * 6/2007 Li .............................. 438/301

FOREIGN PATENT DOCUMENTS

JP 2000-150847 5/2000

OTHER PUBLICATIONS

Merriam-Webster's Collegiate Dictionary, Tenth Edition; 1998; Merriam-Webster, Inc.; pp. 105, 1287.*

* cited by examiner

*Primary Examiner*—Matthew C Landau
*Assistant Examiner*—Jessica Hall
(74) *Attorney, Agent, or Firm*—McDermott Will & Emery LLP

(57) ABSTRACT

A solid-state image sensing apparatus has a signal storage portion of a second conductivity type provided within a substrate, a surface shield layer of the first conductivity type provided in a surface portion of the substrate which is located above the signal storage portion, a gate electrode provided over the substrate in adjacent relation to at least one end of the signal storage portion, and a drain region of the second conductivity type provided in a surface portion of the substrate which is on the side opposite to the surface shield layer when viewed from the gate electrode. A read control layer of the first conductivity type is further provided in a surface portion of the substrate which is located under the gate electrode in adjacent relation to one end of the surface shield layer.

6 Claims, 2 Drawing Sheets

SOLID-STATE IMAGE SENSING APPARATUS AND FABRICATION METHOD THEREOF

BACKGROUND OF THE INVENTION

The present invention relates to a solid-state image sensing apparatus and, more particularly, to a structure of a read transistor portion for reading a signal charge from a photoelectric conversion portion such as a photodiode.

In the field of a solid-state image sensing apparatus, there have been proposed numerous technologies related to a structure of an amplified MOS image sensor which consumes lower power than a CCD image sensor and also allows easy integration between a sensor portion and a peripheral circuit by using the same MOS process.

Referring to FIGS. 4 and 5, a description will be given to an example of a structure of a MOS image sensor shown in Patent Document 1. FIG. 4 is a top view showing a photoelectric conversion portion and a signal read portion in a conventional MOS image sensor. FIG. 5 is a cross-sectional view taken along the line Y1-Y2 of FIG. 4.

As shown in FIGS. 4 and 5, a signal storage portion (photodiode) 102 made of an N-type diffused layer for converting optical light to electric charge and storing the electric charge therein is provided within a P-well 101. A gate electrode 104 is provided over the P-well 101 in adjacent relation to the signal storage portion 102 such that a gate oxide film 103 is interposed between the gate electrode 104 and the P-well 101.

A drain region 105 made of an N-type diffused layer is further provided in a surface portion of the P-well 101 which is on the side opposite to the signal storage portion 102 when viewed from the gate electrode 104. On the other hand, a surface shield layer 106 made of a P-type diffused layer is provided in a surface portion of the P-well 101 which is located above the signal storage portion 102. An isolation portion 107 made of a STI (Shallow Trench Isolation) formed by cutting into a substrate encircles the signal storage portion 102, the drain region 105, and the surface shield layer 106.

[Patent Document 1] Japanese Laid-Open Patent Publication No. 2000-150847

SUMMARY OF THE INVENTION

However, the solid-state image sensing apparatus shown in Patent Document 1 has the problem of significant variations in characteristic degradation, such as an increase in the number of white spots, an increase in the number of residual image electrons, and a reduction in the number of saturated electrons, each resulting from the displacement of an electrode or an impurity region.

In view of the foregoing, it is therefore an object of the present invention to provide a solid-state image sensing apparatus which allows the prevention of characteristic degradation such as an increased number of white spots, an increased number of residual image electrons, and a reduced number of saturated electrons.

To attain the foregoing object, a solid-state image sensing apparatus according to the present invention comprises: a signal storage portion of a second conductivity type provided within a semiconductor substrate or a well each of a first conductivity type to store a signal charge obtained through a photoelectric conversion; a surface shield layer of the first conductivity type provided in a surface portion of the semiconductor substrate or the well which is located above the signal storage portion; a gate electrode provided over the semiconductor substrate or the well in adjacent relation to at least one end of the signal storage portion; and a drain region of the second conductivity type provided in a surface portion of the semiconductor substrate or the well which is on a side opposite to the surface shield layer when viewed from the gate electrode, wherein a read control layer of the first conductivity type is further provided in a surface portion of the semiconductor substrate or the well which is located under the gate electrode in adjacent relation to one end of the surface shield layer.

In the solid-state image sensing apparatus according to the present invention, an impurity concentration in the read control layer is preferably higher than that in the semiconductor substrate or the well and lower than that in the surface shield layer.

In the solid-state image sensing apparatus according to the present invention, an off-state leakage prevention layer of the first conductivity type is preferably provided to cover side and bottom surfaces of the drain region.

In the case where the solid-state image sensing apparatus according to the present invention comprises the off-state leakage prevention layer, the off-state leakage prevention layer preferably extends to a position under an end portion of the gate electrode.

In the case where the solid-state image sensing apparatus according to the present invention comprises the off-state leakage prevention layer, an impurity concentration in the off-state leakage prevention layer is preferably not less than $4 \times 10^{16}$ atom/cm$^3$.

In the solid-state image sensing apparatus according to the present invention, the signal storage portion preferably overlaps the entire gate electrode, while extending to a position under the drain region.

A method for fabricating a solid-state image sensing apparatus according to the present invention is the method for fabricating the solid-state image sensing apparatus described above and comprises the step of: forming at least one of the surface shield layer and the signal storage portion each by using an ion implantation mask.

In the solid-state image sensing apparatus according to the present invention, the read control layer allows the adjustment of an impurity concentration in the vicinity of a portion under the gate electrode. This allows a reduction in the number of residual image electrons, while suppressing the occurrence of white spots. In addition, there is no situation in which the displacement of an implantation mask in the fabrication steps changes the distance between the surface shield layer and the gate electrode. As a result, it is possible to suppress characteristic degradation such as an increased number of white spots, an increased number of residual image electrons, and a reduced number of saturated electrons, each resulting from the displacement of an implantation mask in the fabrication steps.

DETAILED DESCRIPTION OF THE INVENTION

Embodiment

Figure 1:
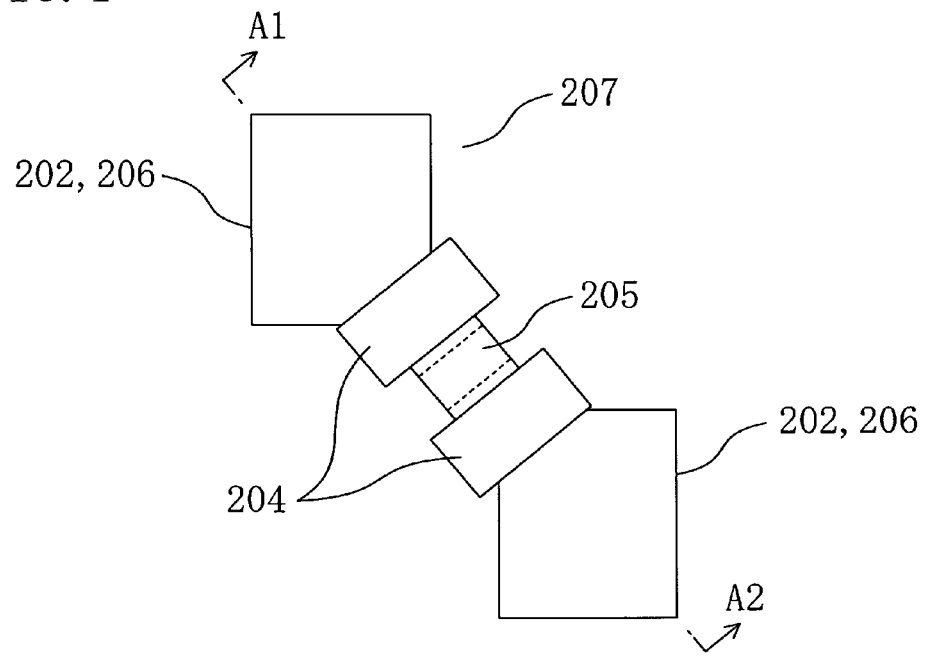
FIG. 1 is a top view showing a structure of the photoelectric conversion portion and signal read portion of two pixels in a MOS image sensor as a solid-state image sensing apparatus according to an embodiment of the present invention.

Referring to the drawings, a description will be given herein below to a solid-state image sensing apparatus and a fabrication method therefor according to an embodiment of the present invention.

Figure 2:
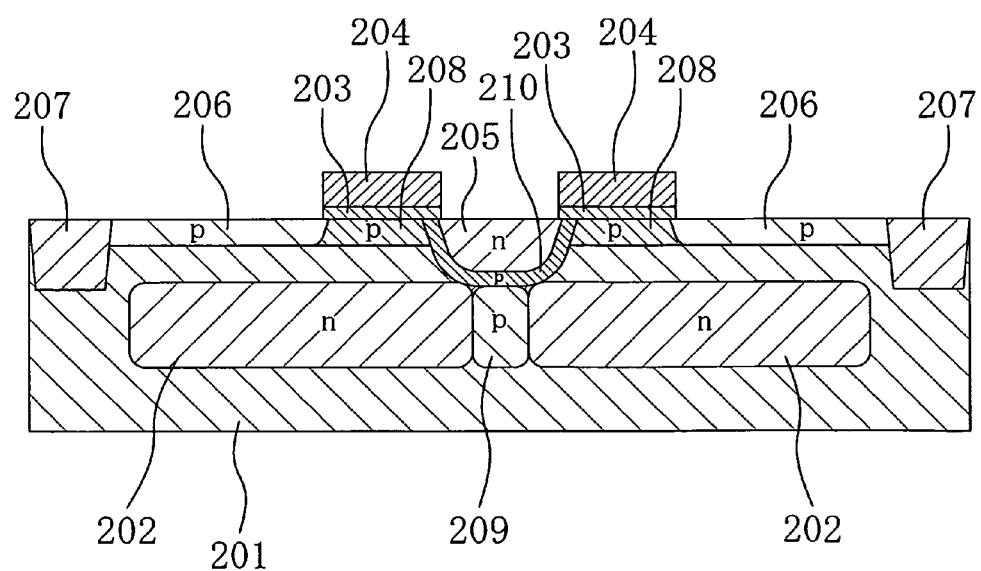
FIG. 2 is a cross-sectional view of the MOS image sensor along the line A1-A2 of FIG. 1.

FIG. 1 is a top view showing a structure of a MOS image sensor according to the embodiment of the present invention. FIG. 2 is a cross-sectional view taken along the line A1-A2 of FIG. 1. In FIG. 1, the end portion of a signal storage portion 202 which is closer to a drain region 205 is indicated by the broken lines.

As shown in FIGS. 1 and 2, the signal storage portion (photodiode) 202 made of an N-type diffusion layer for converting optical light to electric charge and storing the electric charge therein is provided within a P-well 201. A gate electrode 204 is provided over the P-well 201 in adjacent relation to the signal storage portion 202 such that a gate oxide film 203 is interposed between the gate electrode 204 and the P-well 201.

A surface shield layer 206 made of a P-type diffused layer is further provided in the surface portion of the P-well 201 which is located above the signal storage portion 202. On the other hand, a drain region 205 made of an N-type diffused layer is provided in the surface portion of the P-well 201 which is on the side opposite to the surface shield layer 206 when viewed from the gate electrode 204. In short, the surface shield layer 206 is provided in the surface portion of the P-well 201 which is on one side of the gate electrode 204, while the drain region 205 is provided in the surface portion of the P-well 201 which is on the other side of the gate electrode 204. An isolation portion 207 made of a STI (Shallow Trench Isolation) formed by cutting into a substrate encircles the signal storage portion 202, the drain region 205, and the surface shield layer 206.

It is to be noted that the one gate electrode 204, the one signal storage portion 202, and the one drain region 205 constitute a MOS transistor. The presence of the surface shield layer 206 increases a P-type impurity concentration, i.e., hole concentration in the surface portion of the substrate which is located above the signal storage portion 202 and thereby achieves a reduction in leakage current resulting of an interface state and also a reduction in noise.

When the surface shield layer 206 is extended to a position under an end portion of the gate electrode 204, the P-type impurity concentration under the gate electrode 204 is increased so that a barrier is formed in a path along which electrons stored in the signal storage portion 202 are transferred. Accordingly, even when a voltage in the range of about 2.5 V to about 3 V is applied to the gate electrode 204, the electrons stored in the signal storage portion 202 cannot be transferred completely to the drain region 205. Therefore, the present embodiment does not provide the surface shield layer 206 under the end portion of the gate electrode 204.

In the present embodiment, the surface shield layer 206 is provided to be adjacent to the end portion of the gate electrode 204 with no gap formed therebetween. In addition, an off-state leakage prevention layer 210 at a high P-type impurity concentration is provided to cover the side and bottom surfaces of the drain region 205. The off-state leakage prevention layer 210 may also be provided to extend to a position under the end portion of the gate electrode 204. Moreover, a P-type read control layer 208 at an impurity concentration which is higher than in the P-well 201 and lower than in the surface shield layer 206 is formed in the surface portion of the P-well 201 which is located under the gate electrode 204 in adjacent relation to one end of the surface shield layer 206. By controlling the P-type impurity concentration in the read control layer 208, it is possible to reduce a leakage current resulting from an interface state or a stress in the vicinity of a portion under the gate electrode 204 and thereby reduce noise (white spots). At the same time, it is also possible to prevent a situation in which an excessively high impurity concentration in the vicinity of the portion under the gate electrode 204 increases the number of residual image electrons. The P-type impurity concentration in the off-state leakage prevention layer 210 is higher than that in the read control layer 208. The P-type impurity concentration in the read control layer 208 may occasionally be lower than that in the P-well 201 as a result of ion implantation for forming the signal storage portion 202.

The depth of the isolation portion 207 formed of the STI is not less than, e.g., 0.35 μm and the peak position of the impurity concentration in the signal storage portion 202 along the depth thereof is preferably e.g., about 0.17 μm to 0.35 μm and not more than the depth of the isolation portion 207 formed of the STI. This allows easy isolation between the adjacent signal storage portions 202.

In the present embodiment, the voltage applied to the gate electrode 204 when the electrons stored in the signal storage portion 202 is transferred to the drain region 205 is preferably not less than about 4 V. The arrangement allows easier transfer of electrons stored in the signal storage portion 202 to the drain region 205 than in the case where a voltage in the range of about 2.5 V to about 3 V is applied to the gate electrode 204.

Figure 3:
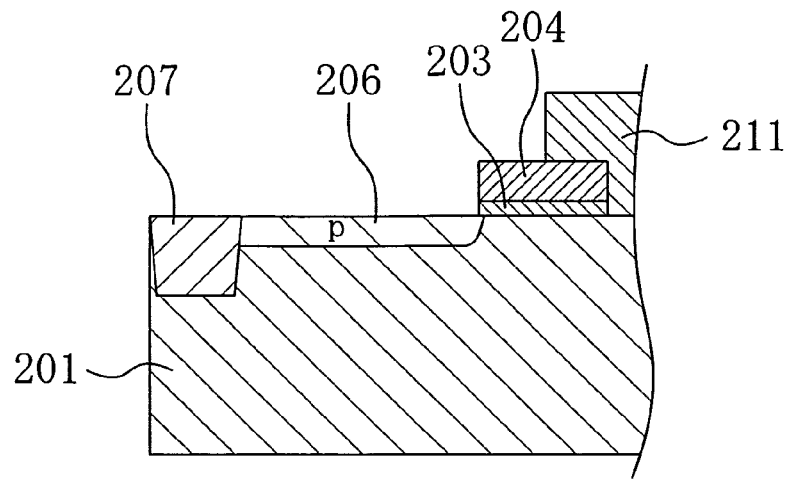
FIG. 3 is a cross-sectional view illustrating the steps of fabricating the solid-state image sensing apparatus according to the embodiment of the present invention.
Figure 4:
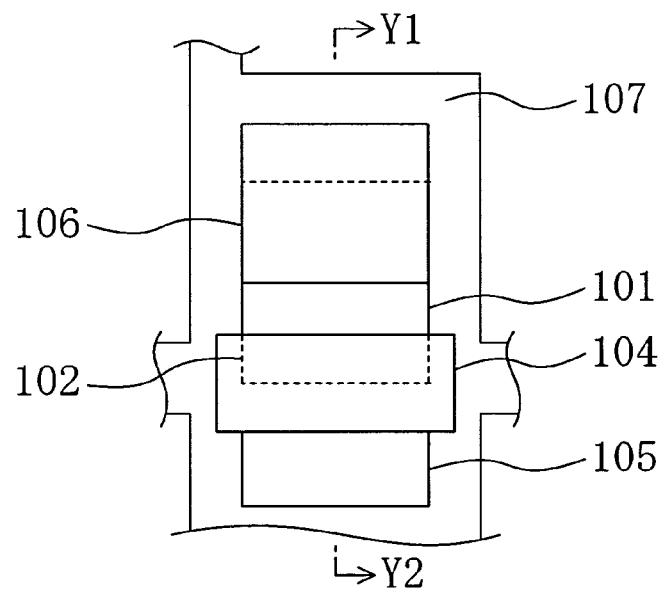
FIG. 4 is a top view showing a structure of the photoelectric conversion portion and signal read portion of a pixel in a conventional MOS image sensor.
Figure 5:
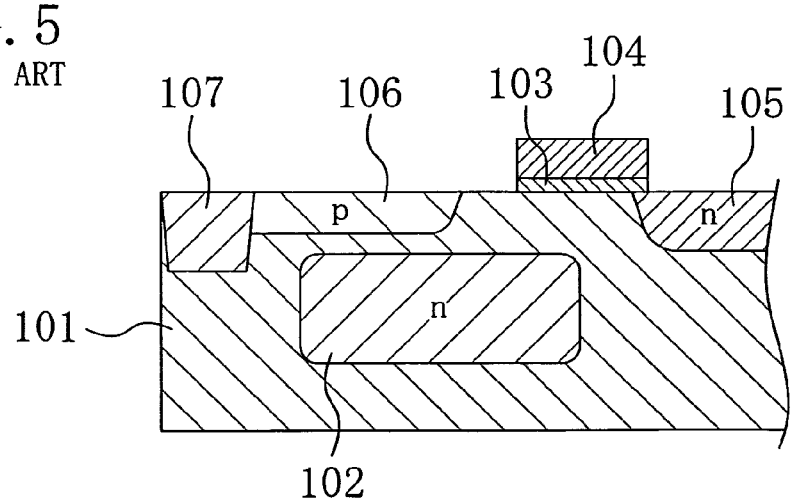
FIG. 5 is a cross-sectional view of the MOS image sensor along the line Y1-Y2 of FIG. 4.

In the fabrication of the solid-state image sensing apparatus according to the present embodiment described above, a resist 211 is formed by a coating process to partially overlap the gate electrode 204, as shown in FIG. 3. By using the resist 211 and the gate electrode 204 as an ion implantation mask, the surface shield layer 206 can be formed in a self alignment manner with respect to the gate electrode 204. This prevents the change of the positional relationship between the surface shield layer 206 and the gate electrode 204, which is caused by the displacement of the implantation mask in the fabrication steps.

Thus, according to the present embodiment, even when the implantation mask for forming the surface shield layer 206 is displaced in the fabrication steps, there is no reduction in hole concentration in the vicinity of the end portion of the gate electrode 204 and conversely no increase in P-type impurity concentration under the gate electrode 204. As a result, it is possible to prevent an increase in the number of white spots and an increase in the number of residual image electrons.

Although the present embodiment has used the resist 211 as the implantation mask in the ion implantation step shown in FIG. 3, it is also possible to use, e.g., a patterned inorganic film as the mask instead of the resist mask.

In the present embodiment, it is sufficient for the gate electrode 204 to overlap at least one end of the signal storage portion 202. However, as shown in FIGS. 1 and 2, the signal storage portion 202 is preferably provided to overlap the entire gate electrode 204 and extend to a position under the drain region 205. The arrangement allows easy transfer of electrons stored in the signal storage portion 202 to the drain region 205.

In the case where the signal storage portion 202 is provided to overlap the entire gate electrode 204 and extend to a position under the drain region 205, the impurity concentration in the off-state leakage prevention layer 210 is preferably adjusted to be not less than $4\times10^{16}$ atom/cm$^3$. The purpose for the adjustment is to prevent electrons stored in the signal storage portion 202 from being transferred to the drain region 205 under a punch-through effect when no voltage is applied to the gate electrode 204.

The above-mentioned structure in which the signal storage portion 202 is provided to overlap the entire gate electrode 204 and extend to a position under the drain region 205 is implementable even when the implantation mask for forming the signal storage portion 202 is displaced in the fabrication of the solid-state image sensing apparatus according to the present embodiment for the following reason. That is, since the signal storage portion 202 is formed sufficiently large to overlap the entire gate electrode 204, it is possible to implement a structure in which the signal storage portion 202 overlaps the entire gate electrode 204 even when the implantation mask is displaced. In addition, because the drain region 205 is formed in a self alignment manner with respect to the gate electrode 204, it is possible to implement a structure in which the signal storage portion 202 extends to a position under the drain region 205 as long as the signal storage portion 202 overlaps the entire gate electrode 204. In the fabrication of the solid-state image sensing apparatus according to the present embodiment, the signal storage portion 202 is formed prior to the formation of the gate electrode 204 and the drain region 205 is formed after the formation of the gate electrode 204.

Therefore, according to the present embodiment, even when the implantation mask for forming the signal storage portion 202 is displaced in the fabrication steps, the distance between the signal storage portion 202 and the drain region 205 remains unchanged. This allows the prevention of an increase in the number of residual image electrons and a reduction in the number of saturated electrons. Moreover, since the signal storage portion 202 is formed large, the effect of increasing the number of saturated electrons is achievable. This is particularly advantageous in the case where the area of the signal storage portion has decreased with miniaturization.

In the present embodiment, not only the resist mask but also, e.g., a patterned inorganic mask can be used as the implantation mask for forming the signal storage portion 202.

In the present embodiment, the one gate electrode 204, the one signal storage portion 202, and the one drain region 205 constitute a MOS transistor, as mentioned above.

In terms of miniaturization, however, the drain region 205 is preferably shared by two MOS transistors, as shown in FIGS. 1 and 2.

In the case where the drain region 205 is shared by a plurality of MOS transistors, i.e., a plurality of pixels, the distance between the respective signal storage portions 202 of individual pixels is reduced so that a pixel isolation layer 209 made of a P-type diffused layer is preferably formed between the respective signal storage portions 202 of the individual pixels. The P-type impurity concentration in the pixel isolation layer 209 is higher than that in the P-well 201 and lower than that in the off-state leakage prevention layer 210.

The arrangement allows easy isolation between the individual signal storage portions 202 and thereby allows the prevention of a problem such as color mixing on a reproduction image plane. This is particularly advantageous when the distance between the individual signal storage portions is reduced with miniaturization.

Thus, in the solid-state image sensing apparatus according to the embodiment of the present invention, even when the implantation mask for forming the surface shield layer 206 is displaced away from the gate electrode 204 (in the direction in which the overlapping range between the implantation mask and the gate electrode 204 increases), e.g., the surface shield layer 206 is kept from coming away from the gate electrode 204 since the surface shield layer 206 can be formed in a self alignment manner with respect to the gate electrode 204. This allows the prevention of a reduction in hole concentration in the vicinity of the end portion of the gate electrode 204.

Thus, according to the solid-state image sensing apparatus according to the embodiment of the present invention, it is possible to prevent the characteristic degradation of the occurrence of white spots on the image plane due to an increase in leakage current resulting from the interface state or stress.

In other words, a method for fabricating the solid-state image sensing apparatus according the embodiment of the present invention can prevent a situation in which "the implantation mask for forming the surface shield layer 206 is displaced away from the gate electrode 204 (in the direction in which the overlapping range between the implantation mask and the gate electrode 204 increases), the surface shield layer 206 resultantly comes away from the gate electrode 204, the hole concentration lowers in the vicinity of the end portion of the gate electrode 204, and a leakage current resulting from the interface state or stress is increased thereby to result in the occurrence of white spots on the reproduction image plane".

In the solid-state image sensing apparatus according to the embodiment of the present invention, even when the implantation mask for forming the surface shield layer 206 is conversely displaced toward the gate electrode 204 (in the direction in which the overlapping range between the implantation mask and the gate electrode 204 decreases), e.g., the surface shield layer 206 is kept from being formed under the gate electrode 204 since the surface shield layer 206 can be formed in a self alignment manner with respect to the gate electrode 204. This prevents the P-type impurity concentration under the gate electrode 204 from becoming higher and thereby prevents the formation of a barrier in the path along which the electrons stored in the signal storage portion 202 are transferred to the drain region 205.

Thus, the solid-state image sensing apparatus according to the embodiment of the present invention allows the prevention of the characteristic degradation of an increased number of residual image electrons resulting from electrons stored in the signal storage portion 202 which remain therein without being transferred to the drain region 205 when a voltage in the range of, e.g., about 2.5 V to about 3 V is applied to the gate electrode 204.

In other words, the method for fabricating the solid-state image sensing apparatus according the embodiment of the present invention can prevent a situation in which "the implantation mask for forming the surface shield layer 206 is displaced toward the gate electrode 204 (in the direction in which the overlapping range between the implantation mask and the gate electrode 204 decreases), the surface shield layer 206 is resultantly formed under the gate electrode 204, the P-type impurity concentration under the gate electrode 204 increases, a barrier is formed thereby in the path along which electrons are transferred from the signal storage portion 202 to the drain region 205, and consequently the number of residual image electrons increases due to the difficulty in transferring the electrons stored in the signal storage portion 202 to the drain region 205 even when a voltage in the range of, e.g., about 2.5 V to about 3 V is applied to the gate electrode 204.

Further, in the solid-state image sensing apparatus according to the embodiment of the present invention, even when the implantation mask for forming the signal storage portion 202 is displaced away from the drain region 205 (in the direction away from the area in which the drain region 205 is formed), e.g., the signal storage portion 202 is kept from coming away from the drain region 205 since the drain region 205 is formed in a self alignment manner with respect to the gate electrode 204 which is entirely overlapping the signal storage portion 202.

Thus, the solid-state image sensing apparatus according to the embodiment of the present invention allows the prevention of the characteristic degradation of an increased number of residual image electrons resulting from electrons stored in the signal storage portion 202 which remain therein without being transferred to the drain region 205 when a voltage in the range of, e.g., about 2.5 V to about 3 V is applied to the gate electrode 204.

In other words, the method for fabricating the solid-state image sensing apparatus according the embodiment of the present invention can prevent a situation in which "the implantation mask for forming the signal storage portion 202 is displaced away from the drain region 205 (in the direction away from the area in which the drain region 205 is formed), the signal storage portion 202 resultantly comes away from the drain region 205, and the characteristic degradation of an increased number of residual image electrons occurs due to the difficulty in transferring the electrons stored in the signal storage portion 202 to the drain region 205 even when a voltage in the range of, e.g., about 2.5 V to about 3 V is applied to the gate electrode 204.

In the solid-state image sensing apparatus according to the embodiment of the present invention, even when the implantation mask for forming the signal storage portion 202 is conversely displaced toward the drain region 205 (in the direction approaching the area in which the drain region 205 is formed or increasing the overlapping range between the implantation mask and the area), e.g., the signal storage portion 202 is kept from further approaching the drain region 205 in a horizontal direction since the drain region 205 is formed in a self alignment manner with respect to the gate electrode 204 which is entirely overlapping the signal storage portion 202.

Thus, the solid-state image sensing apparatus according to the embodiment of the present invention allows the prevention of the characteristic degradation of a reduced number of saturated electrons due to the punch-through effect.

In other words, the method for fabricating the solid-state image sensing apparatus according the embodiment of the present invention can prevent a situation in which "the implantation mask for forming the signal storage portion 202 is displaced toward the drain region 205 (in the direction approaching the area in which the drain region 205 is formed or increasing the overlapping range between the implantation mask and the area), the signal storage portion 202 resultantly comes closer to the drain region 205 to increase the probability of the occurrence of the punch-through, and the characteristic degradation of a reduced number of saturated electrons is caused thereby.

In the present embodiment, the P-well 201 may also be a P-type semiconductor substrate. Even when the conductivity type of each of the components used in the present embodiment is replaced with the opposite conductivity type, the same effects as achieved in the present embodiment can also be achieved.

What is claimed is:

1. A solid-state image sensing apparatus comprising:
   first and second signal storage portions of a second conductivity type provided within a semiconductor substrate or a well each of a first conductivity type to store a signal charge obtained through a photoelectric conversion;
   a first surface shield layer of the first conductivity type provided in a surface portion of the semiconductor substrate or the well which is located above the first signal storage portion;
   a second surface shield layer of the first conductivity type provided in a surface portion of the semiconductor substrate or the well which is located above the second signal storage portion;
   a first gate electrode provided over the semiconductor substrate or the well in adjacent relation to at least one end of the first signal storage portion;
   a second gate electrode provided over the semiconductor substrate or the well in adjacent relation to at least one end of the second signal storage portion;
   a drain region of the second conductivity type provided in a surface portion of the semiconductor substrate or the well which is located between the first gate electrode and the second gate electrode;
   a first read control layer of the first conductivity type provided in a surface portion of the semiconductor substrate or the well which is located under the first gate electrode in adjacent relation to one end of the first surface shield layer; and
   a second read control layer of the first conductivity type provided in a surface portion of the semiconductor substrate or the well which is located below the second gate electrode in adjacent relation to one end of the second surface shield layer,
   wherein the first signal storage portion overlaps the entire first gate electrode and at least a part of the drain region, and
   the second signal storage portion overlaps the entire second gate electrode and at least a part of the drain region.

2. The solid-state image sensing apparatus of claim 1, wherein an impurity concentration in the first and second read control layers is higher than that in the semiconductor substrate or the well and lower than that in the first and second surface shield layers.

3. The solid-state image sensing apparatus of claim 1, wherein an off-state leakage prevention layer of the first conductivity type is provided to cover side and bottom surfaces of the drain region.

4. The solid-state image sensing apparatus of claim 3, wherein the off-state leakage prevention layer extends to positions under end portions of the first and second gate electrodes.

5. The solid-state image sensing apparatus of claim 3, wherein an impurity concentration in the off-state leakage prevention layer is not less than $4 \times 10^{16}$ atom/cm$^3$.

6. A method for fabricating the solid-state image sensing apparatus of claim 1, the method comprising the steps of:
   forming at least one of the first surface shield layer and the first signal storage portion each by using an ion implantation mask so that the first signal storage portion overlaps the entire first gate electrode and at least a part of the drain region; and
   forming at least one of the second surface shield layer and the second signal storage portion each by using an ion implantation mask so that the second signal storage portion overlaps the entire second gate electrode and at least a art of the drain region.

* * * * *